US012566387B2

(12) United States Patent
Bae et al.

(10) Patent No.: US 12,566,387 B2
(45) Date of Patent: Mar. 3, 2026

(54) BUFFER UNIT AND SUBSTRATE TREATING APPARATUS INCLUDING THE SAME

(71) Applicant: SEMES CO., LTD., Cheonan-si (KR)

(72) Inventors: Jong Kook Bae, Pyeongtaek-si (KR); Tae Won Yun, Namwon-si (KR); Chang Ho Kim, Osan-si (KR); Hyun Yang Jeong, Hwaseong-si (KR); Sung Hun Eom, Hwaseong-si (KR)

(73) Assignee: Semes Co., LTD., Cheonan-si (KR)

( * ) Notice: Subject to any disclaimer, the term of this patent is extended or adjusted under 35 U.S.C. 154(b) by 509 days.

(21) Appl. No.: 18/063,410

(22) Filed: Dec. 8, 2022

(65) Prior Publication Data

US 2023/0195001 A1      Jun. 22, 2023

(30) Foreign Application Priority Data

Dec. 20, 2021    (KR) ......................... 10-2021-0182934

(51) Int. Cl.
*G03F 7/00* (2006.01)
*G03F 7/20* (2006.01)

(52) U.S. Cl.
CPC ............ *G03F 7/709* (2013.01); *G03F 7/2041* (2013.01); *G03F 7/70825* (2013.01)

(58) Field of Classification Search
CPC ............ G03F 7/70825; G03F 7/70991; G03F 7/7075; G03F 7/709; G03F 7/2041; H01L 21/67109; H01L 21/67167; H01L 21/67303; H01L 21/67309; H01L 21/67346; H01L 21/67369; H01L 21/68771; H01L 21/68707; H01L 21/68785; B25J 15/0019
See application file for complete search history.

(56) References Cited

U.S. PATENT DOCUMENTS 4,727,993 A * 3/1988 Mirkovich ............. H01J 37/20
                                                    211/41.18
10,763,152 B2 9/2020 Jo et al.
11,590,996 B2 2/2023 Hsu et al.
(Continued)

FOREIGN PATENT DOCUMENTS

CN        102310982 A    1/2012
CN        108122817 A    6/2018
(Continued)

OTHER PUBLICATIONS

Office Action for Korean Application No. 10-2021-0182934 dated Sep. 1, 2023.
(Continued)

*Primary Examiner* — Glenn F Myers
(74) *Attorney, Agent, or Firm* — Harness, Dickey & Pierce, P.L.C.

(57) ABSTRACT

Disclosed are a buffer unit, in which a plurality of support plates is stacked in a vertical direction and a connection block is provided between the plurality of support plates to prevent vibration generated at the lower end of the support plate from being transmitted from the upper support plate, and a substrate treating apparatus. According to the present invention, it is possible to reduce the vibration generated in the buffer unit, so that there is an effect of improving the efficiency of the substrate treating process.

9 Claims, 10 Drawing Sheets

(56)  References Cited

U.S. PATENT DOCUMENTS

| | | | |
|---|---|---|---|
| 12,017,695 B2 | 6/2024 | Hsu et al. | |
| 12,434,753 B2 | 10/2025 | Hsu et al. | |
| 2005/0072716 A1* | 4/2005 | Quiles | H01L 21/67017 |
| | | | 206/725 |
| 2007/0218706 A1* | 9/2007 | Matsuoka | H01L 21/6719 |
| | | | 118/724 |
| 2008/0207508 A1* | 8/2008 | Dobson | A61K 38/16 |
| | | | 514/14.6 |
| 2021/0384055 A1* | 12/2021 | Kim | H01L 21/6732 |

FOREIGN PATENT DOCUMENTS

| | | | | | |
|---|---|---|---|---|---|
| CN | 110775128 | A | 2/2020 | | |
| CN | 211392294 | U | 9/2020 | | |
| CN | 112242327 | A | 1/2021 | | |
| JP | 2001242364 | A | * 9/2001 | | G03F 7/70825 |
| JP | 2007250678 | A | 9/2007 | | |
| JP | 2019-033241 | A | 2/2019 | | |
| KR | 10-2000-0026641 | A | 5/2000 | | |
| KR | 10-2020-0122691 | A | 10/2020 | | |
| TW | 200736128 | A | 10/2007 | | |

OTHER PUBLICATIONS

Chinese Office Action issued Jul. 27, 2025 in Chinese Patent Application No. 202211642750.X.

* cited by examiner

BUFFER UNIT AND SUBSTRATE TREATING APPARATUS INCLUDING THE SAME

CROSS-REFERENCE TO RELATED APPLICATIONS

This application claims priority to and the benefit of Korean Patent Application No. 10-2021-0182934 filed in the Korean Intellectual Property Office on Dec. 20, 2021, the entire contents of which are incorporated herein by reference.

TECHNICAL FIELD

The present invention relates to a buffer unit for storing a substrate and a substrate treating apparatus including the same.

BACKGROUND ART

In general, in order to manufacture a semiconductor device, various processes, such as cleaning, deposition, photolithography, etching, and ion implantation, are performed.

A photolithography process performed to form a pattern plays an important role in achieving high integration of a semiconductor device.

The photolithography process is performed to form a photoresist pattern on a semiconductor substrate.

The photolithography process includes a coating and soft bake process for forming a photoresist film on a substrate, an exposure and development process for forming a photoresist pattern from the photoresist film, an edge bead removal process and an edge exposure process for removing an edge portion of the photoresist film or pattern, and a hard bake process for stabilizing and densifying the photoresist pattern.

In such the substrate manufacturing process, a buffer unit for temporarily storing or cooling a substrate for a next process after one process is performed is provided.

In the substrate treating apparatus, the buffer unit is fixed by a frame between an index module and a processing module. The buffer unit includes a plurality of support plates arranged in the vertical direction. A robot provided in the index module transfers the substrate between the plurality of support plates, and the transfer robot provided in the processing module transfers the substrate supported by the support plate to the processing unit.

As the robot of the index module moves, vibration is generated, or vibration occurs in the substrate treating apparatus due to vibration by the transfer robot of the processing module or movement of a nozzle in a coating block.

The above vibration is transmitted to the substrate seated on the support plate of the buffer unit, and when the vibration is large, the substrate is separated from the buffer unit or the substrate is displaced from its original position in the buffer unit.

SUMMARY OF THE INVENTION

The present invention has been made in an effort to provide a buffer unit for preventing a substrate supported by the buffer unit from leaving the buffer unit or being displaced from its original position in the buffer unit due to vibration, and a substrate treating apparatus including the same.

The object of the present invention is not limited thereto, and other objects not mentioned will be clearly understood by those of ordinary skill in the art from the following description.

An exemplary embodiment of the present invention provides a buffer unit for storing or treating a substrate, the buffer unit including: a plurality of support plates arranged to be stacked in a vertical direction and supporting a substrate; a plurality of connection blocks respectively positioned between the support plates so that the adjacent support plates are vertically spaced apart from each other; and an anti-vibration pad disposed between the support plate and the connection block to prevent vibration from being transmitted from the bottom to the top.

According to the exemplary embodiment, each of the anti-vibration pads may be provided between an upper surface of the connection block and a lower surface of the support plate.

According to the exemplary embodiment, the anti-vibration pads may be provided between the support plates and the connection blocks, respectively, and are provided with thinner thicknesses as being disposed at the top.

According to the exemplary embodiment, the plurality of connection blocks may be provided with a thicker thickness as the connection blocks are disposed at the top.

According to the exemplary embodiment, sums of the thicknesses of the adjacent connection blocks and the anti-vibration pad may be equal to each other.

According to the exemplary embodiment, some of the plurality of anti-vibration pads may be provided with different materials.

According to the exemplary embodiment, a first anti-vibration pad and a second anti-vibration pad may be provided between the adjacent connection block and support plate, and the first anti-vibration pad and the second anti-vibration pad may be provided with different materials.

According to the exemplary embodiment, a cooling flow path through which a cooling fluid for cooling the substrate flows may be formed in at least one of the plurality of support plates.

Another exemplary embodiment of the present invention provides a buffer unit, including: a first support plate; a second support plate disposed above the first support plate; a third support plate disposed above the second support plate; a first connection block inserted between the first support plate and the second support plate such that the first support plate and the second support plate are vertically spaced apart from each other; a second connection block inserted between the second support plate and the third support plate such that the second support plate and the third support plate are vertically spaced apart from each other; a first anti-vibration pad disposed between the first support plate and the second support plate to prevent vibration from being transmitted from the bottom to the top; and a second anti-vibration pad disposed between the second support plate and the third support plate to prevent vibration from being transmitted from the bottom to the top.

According to the exemplary embodiment, the first anti-vibration pad may be disposed between the first connection block and the first support plate, and the second anti-vibration pad may be disposed between the second connection block and the second support plate.

According to the exemplary embodiment, the first anti-vibration pad and the second anti-vibration pad may be provided with different materials.

According to the exemplary embodiment, the first anti-vibration pad may be provided with a thicker thickness than a thickness of the second anti-vibration pad.

According to the exemplary embodiment, the first connection block may be provided with a thinner thickness than a thickness of the second connection block.

According to the exemplary embodiment, a sum of the thicknesses of the first connection block and the first anti-vibration pad may be the same as a sum of the thicknesses of the second connection block and the second anti-vibration pad.

According to the exemplary embodiment, a cooling flow path through which a cooling fluid for cooling a substrate flows may be formed in each of the first to third support plates.

According to the exemplary embodiment, the buffer unit may further include: a base block disposed under the first support plate, in which the base block may include: an inlet port for receiving a cooling fluid from the outside; and an outlet port for discharging the cooling fluid to the outside, and each of the first support plate, the second support plate, the third support plate, the first connection block, and the second connection block is provided with a cooling fluid supply flow path connected to the inlet port, and a cooling fluid recovery flow path connected to the outlet port, and the cooling flow path may have one end connected to the cooling fluid supply flow path and the other end connected to the cooling fluid recovery flow path.

Still another exemplary embodiment of the present invention provides a substrate treating apparatus, including: an index module for loading or unloading a substrate; a processing module for performing a process for treating the substrate; and a buffer unit disposed between the index module and the processing module, in which the buffer unit includes: a plurality of support plates arranged to be stacked in a vertical direction and supporting the substrate; and a plurality of connection blocks respectively positioned between the support plates so that the adjacent support plates are spaced apart from each other; and an anti-vibration pad disposed between the support plate and the connection block to prevent vibration from being transmitted from the bottom to the top.

According to the exemplary embodiment, at least one of the plurality of support plates may be provided with a cooling member for cooling the substrate.

According to the exemplary embodiment, the anti-vibration pads may be provided between the support plates and the connection blocks, respectively, and are provided with thinner thicknesses as being disposed at the top.

According to the exemplary embodiment, the connection block may be provided with a thicker thickness as being disposed at the top, and sums of the thicknesses of the adjacent connection block and anti-vibration pad may be equal to each other.

According to the exemplary embodiment of the present invention, it is possible to reduce vibration generated in the buffer unit, thereby improving the efficiency of the substrate treating process.

In addition, according to the exemplary embodiment of the present invention, it is possible to perform the cooling process in the buffer unit for storing the substrate, thereby minimizing the time for the substrate processing process.

The effect of the present invention is not limited to the foregoing effects, and those skilled in the art may clearly understand non-mentioned effects from the present specification and the accompanying drawings.

BRIEF DESCRIPTION OF THE DRAWINGS

FIG. 3 is a top plan view of the substrate treating apparatus of FIG. 1.

DETAILED DESCRIPTION

Figure 1:
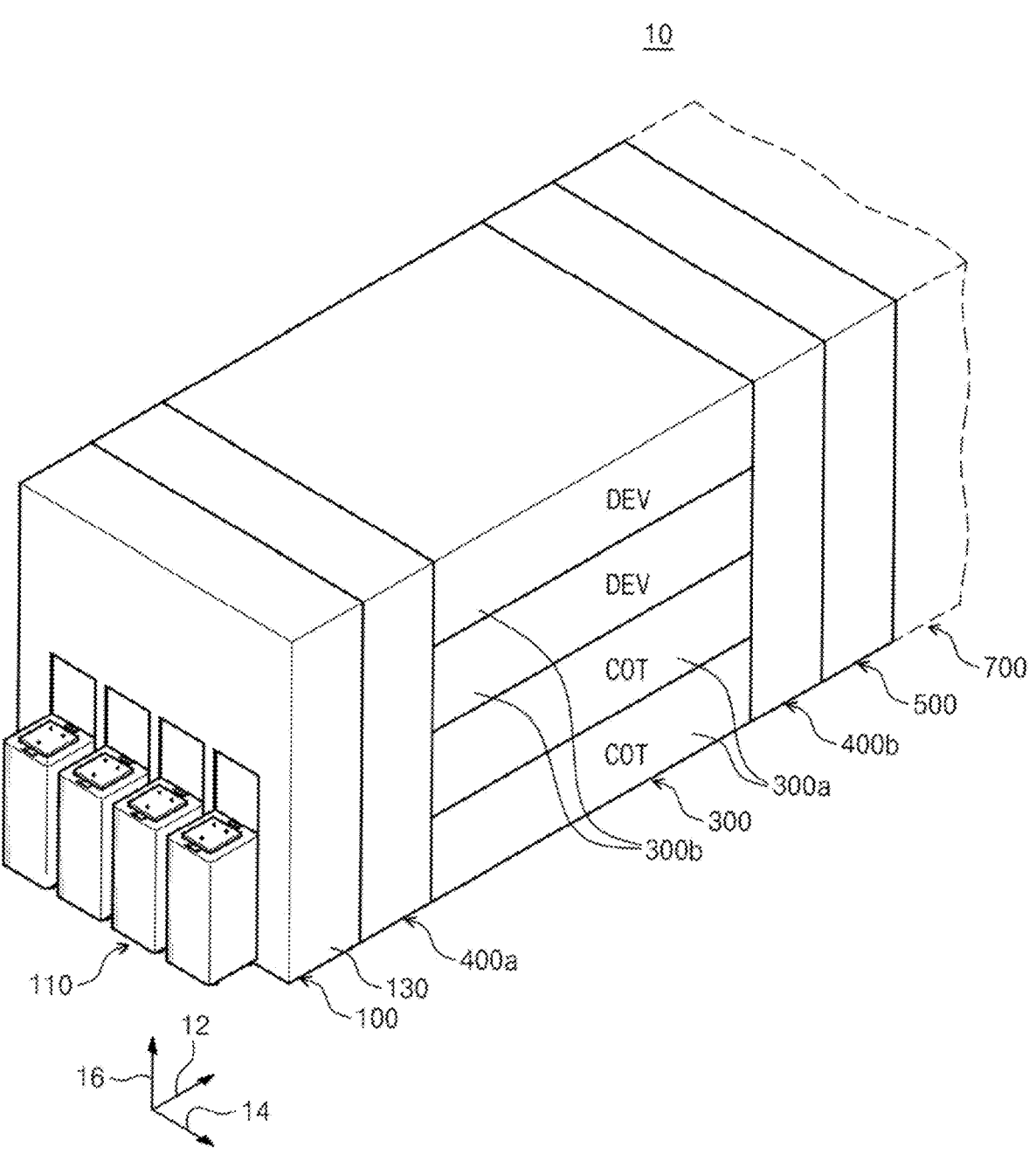
FIG. 1 is a perspective view schematically illustrating a substrate treating apparatus according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

Unless explicitly described to the contrary, the word "comprise" and variations, such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

The equipment of the present exemplary embodiment will be described by taking as an example a case in which a photolithography process is performed on a substrate, such as a semiconductor wafer, or a flat panel display panel.

Hereinafter, an exemplary embodiment of the present invention will be described in detail with reference to FIGS. 1 to 15.

Figure 2:
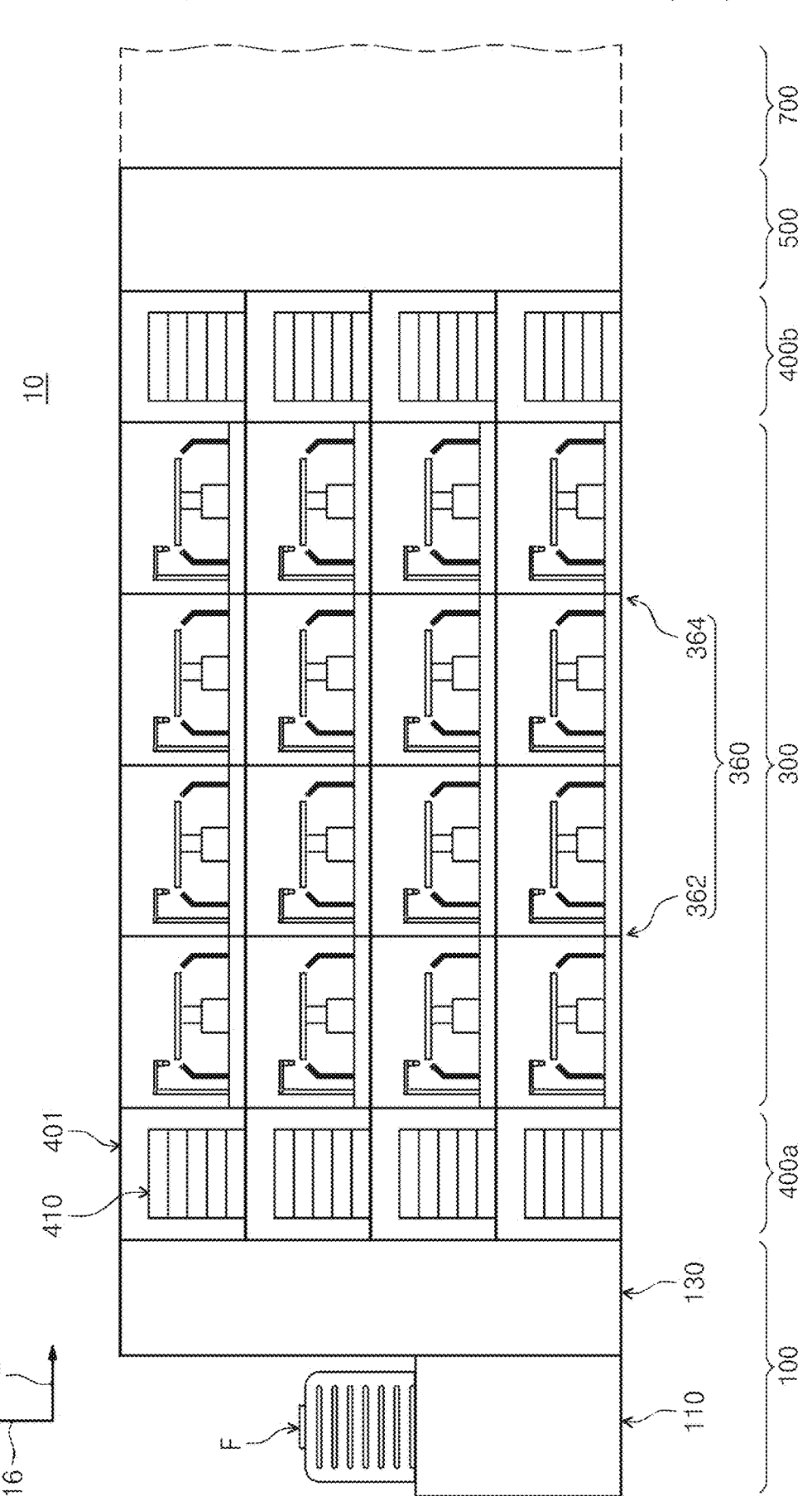
FIG. 2 is a cross-sectional view illustrating a coating block or a developing block of the substrate treating apparatus of FIG. 1.
Figure 3:
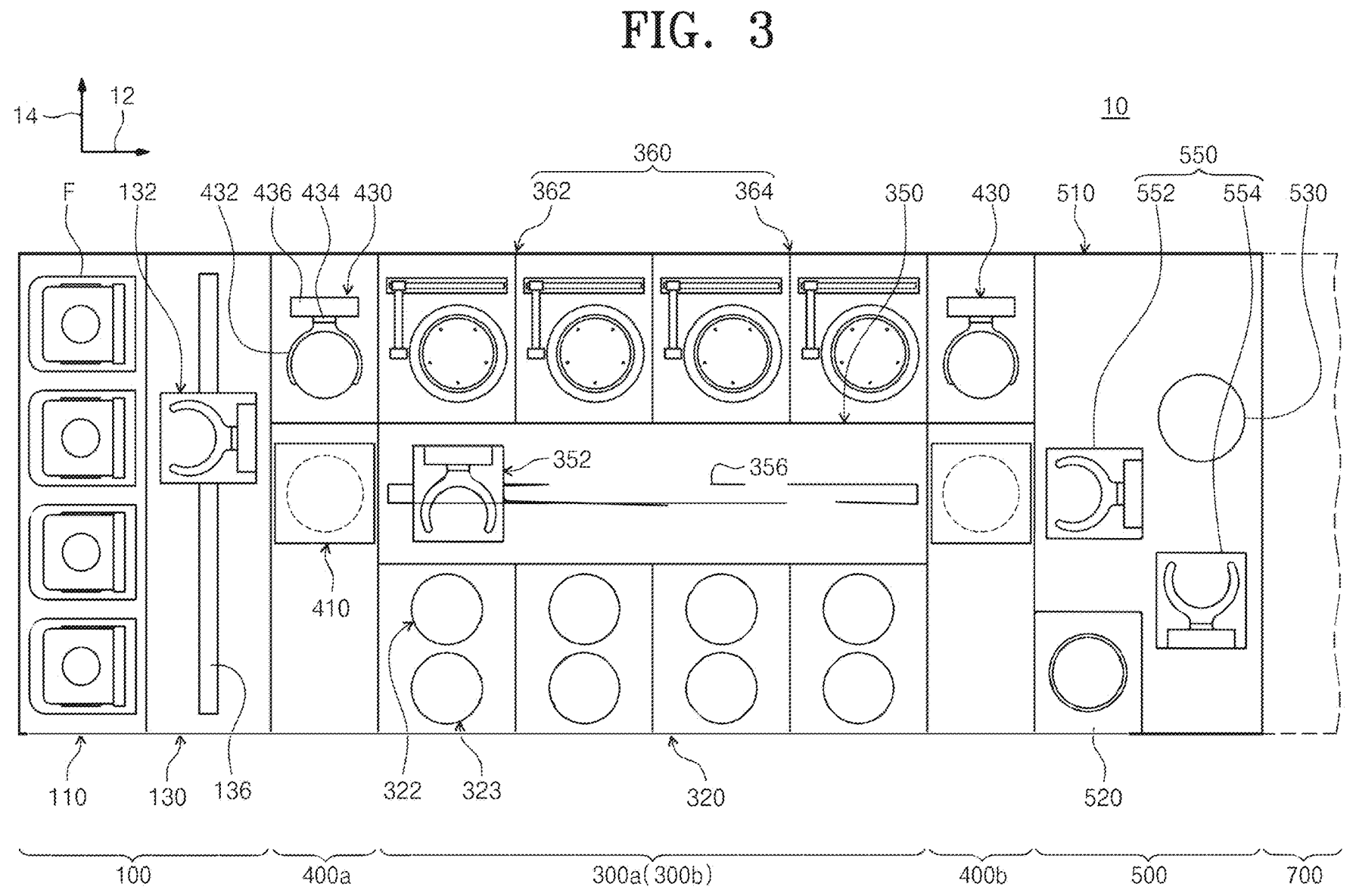

FIG. 1 is a perspective view schematically illustrating a substrate treating apparatus according to an exemplary embodiment of the present invention. FIG. 2 is a cross-sectional view illustrating a coating block or a developing block of the substrate treating apparatus of FIG. 1. FIG. 3 is a top plan view of the substrate treating apparatus of FIG. 1.

Referring to FIGS. 1 to 3, a substrate treating apparatus 10 according to the exemplary embodiment of the present invention includes an index module 100, a processing module 300, a buffer module, and an interface module 500. Hereinafter, a direction in which the index module 100, the processing module 300, the buffer modules 400a and 400b, and the interface module 500 are arranged is referred to as a first direction 12, when viewed from the top, a direction perpendicular to the first direction 12 is referred to as a second direction 14, and a direction perpendicular to both the first direction 12 and the second direction 14 is referred to as a third direction 16.

The index module 100 transfers a substrate W to the processing module 300 from a container F in which the substrate W is accommodated, and receives the completely treated substrate W into the container F. A longitudinal direction of the index module 100 is provided in the second direction 14. The index module 100 includes a load port 110 and an index frame 130. With respect to the index frame 130, the load port 110 is located on the opposite side of the processing module 300. The container F in which the substrates W are accommodated is placed on the load port 110. A plurality of load ports 110 may be provided, and the plurality of load ports 110 may be disposed along the second direction 14.

As the container F, an airtight container F, such as a Front Open Unified Pod (FOUP), may be used. The container F may be placed on the load port 110 by a transfer means (not illustrated), such as an overhead transfer, an overhead conveyor, or an automatic guided vehicle, or an operator.

An index robot 132 is provided inside the index frame 130. A guide rail 136 of which a longitudinal direction is provided in the second direction 14 is provided within the index frame 130, and the index robot 132 may be provided to be movable on the guide rail 136. The index robot 132 includes a hand on which the substrate W is placed, and the hand is provided to be movable forward and backward, rotatable about the third direction 16, and movable in the third direction 16.

The processing module 300 may perform a coating process and a developing process on the substrate W. The processing module 300 may receive the substrate W accommodated in the container F and perform a substrate treating process. The processing module 300 includes a coating block 300a and a developing block 300b. The coting block 300a performs a coating process on the substrate W, and the developing block 300b performs a developing process on the substrate W. A plurality of coating blocks 300a is provided, and the coating blocks 300a are provided to be stacked on each other. A plurality of developing blocks 300b is provided, and the developing blocks 300b are provided to be stacked on each other. According to the exemplary embodiment of FIG. 1, two coating blocks 300a and two developing blocks 300b are provided respectively. The coating blocks 300a may be disposed under the developing blocks 300b. According to an example, the two coating blocks 300a perform the same process, and may be provided in the same structure. Further, the two developing blocks 300b may perform the same process and may be provided in the same structure.

Referring to FIG. 3, the coating block 300a performs a heat treatment process on the substrate W in the heat treating chamber 320, the transfer chamber 350, and the liquid treating chamber 360. The heat treatment process may include a cooling process and a heating process. The liquid treating chamber 360 supplies a liquid onto the substrate W to form a liquid film. The liquid film may be a photoresist film or an antireflection film. The transfer chamber 350 transfers the substrate W between the heat treating chamber 320 and the liquid treating chamber 360 in the coating block 300a.

The transfer chamber 350 is provided so that a longitudinal direction thereof is parallel to the first direction 12. The transfer robot 350 is provided to the transfer chamber 352. The transfer robot 352 transfers a substrate between the heat treating chamber 320, the liquid treating chamber 360, and the buffer module 400. According to an example, the transfer robot 352 includes a hand on which the substrate W is placed, and the hand may be provided to be movable forward and backward, rotatable about the third direction 16, and movable in the third direction 16. A guide rail 356, of which a longitudinal direction is parallel to the first direction 12, is provided within the transfer chamber 350, and the transfer robot 900 may be provided to be movable on the guide rail 356.

Figure 4:
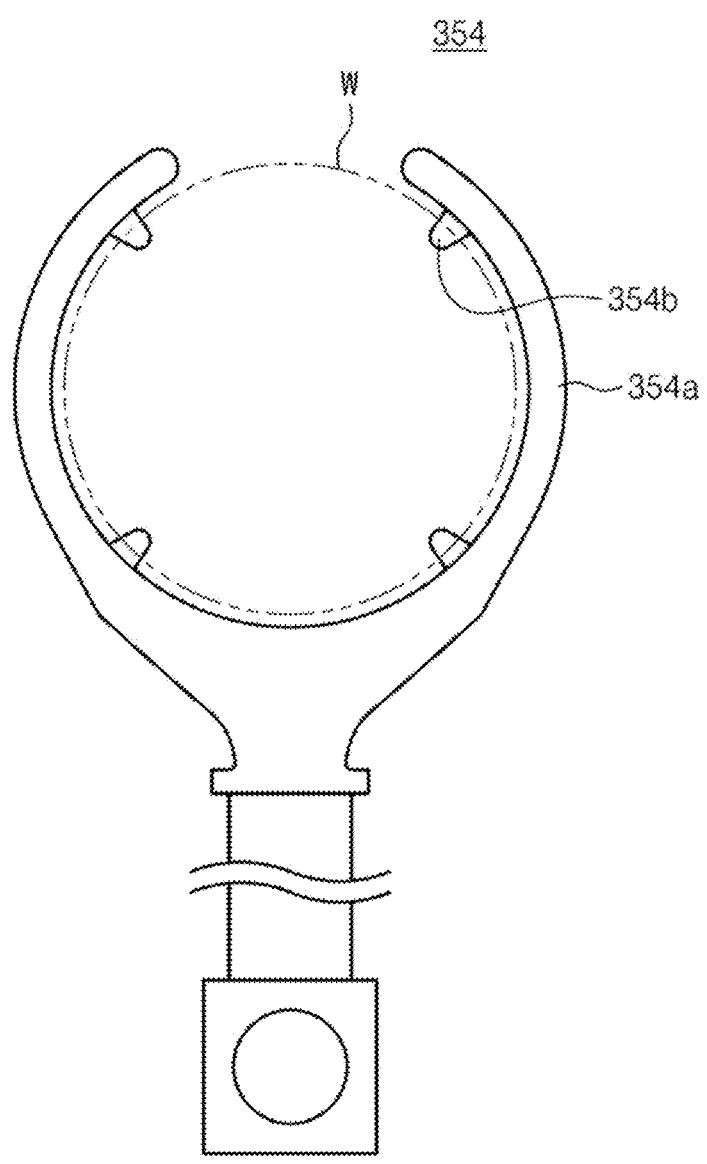
FIG. 4 is a top plan view schematically illustrating a transfer robot of FIG. 3.

FIG. 4 is a diagram illustrating an example of a hand 354 of the transfer robot 352 of FIG. 3. Referring to FIG. 4, the hand 354 includes a base 354a and a support protrusion 354b. The base 354a may have an annular ring shape in which a part of the circumference is bent. The base 354a has an inner diameter greater than the diameter of the substrate W. The support protrusion 354b extends inwardly from the base 354a. A plurality of support protrusions 354b is provided, and supports an edge region of the substrate W. According to an example, four support protrusions 354b may be provided at equal intervals.

A plurality of heat treating chambers 320 is provided. The heat treating chambers 320 are disposed along the first direction 12. The heat treating chambers 320 are located at one side of the transfer chamber 350.

Figure 5:
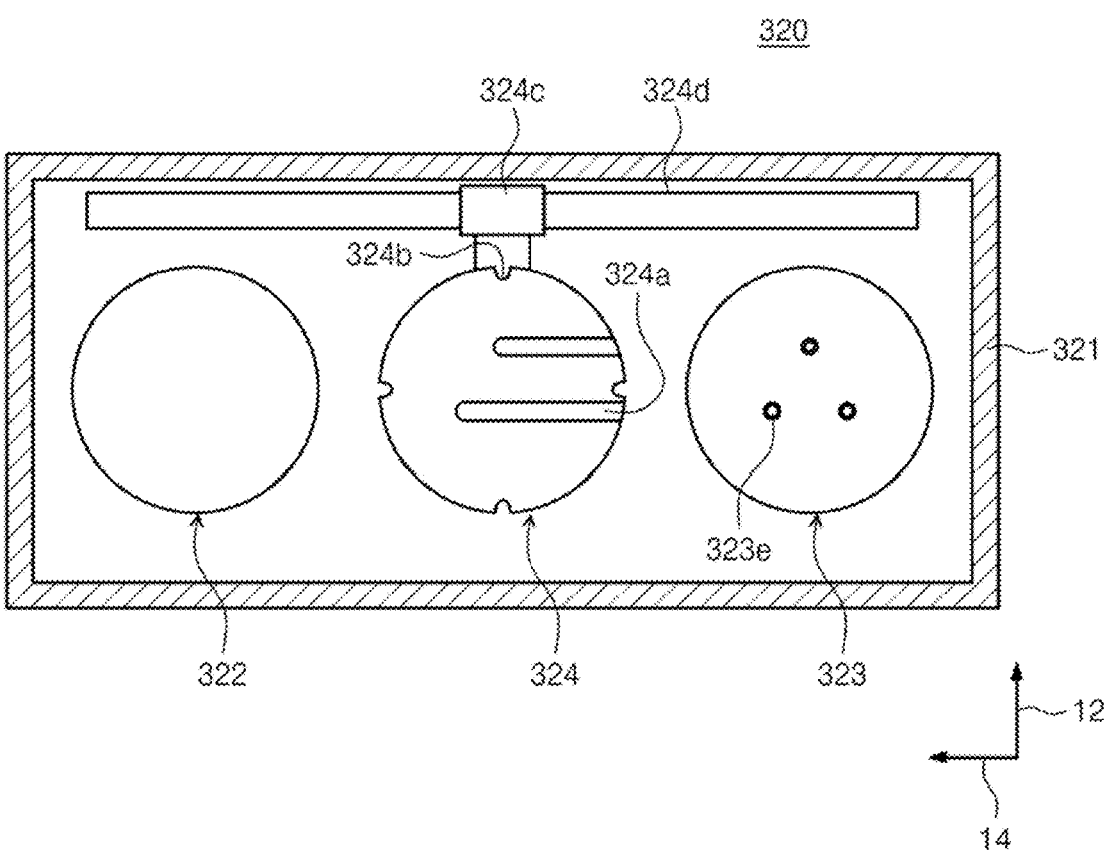
FIG. 5 is a top plan view schematically illustrating an example of a heat treating chamber of FIG. 3.
Figure 6:
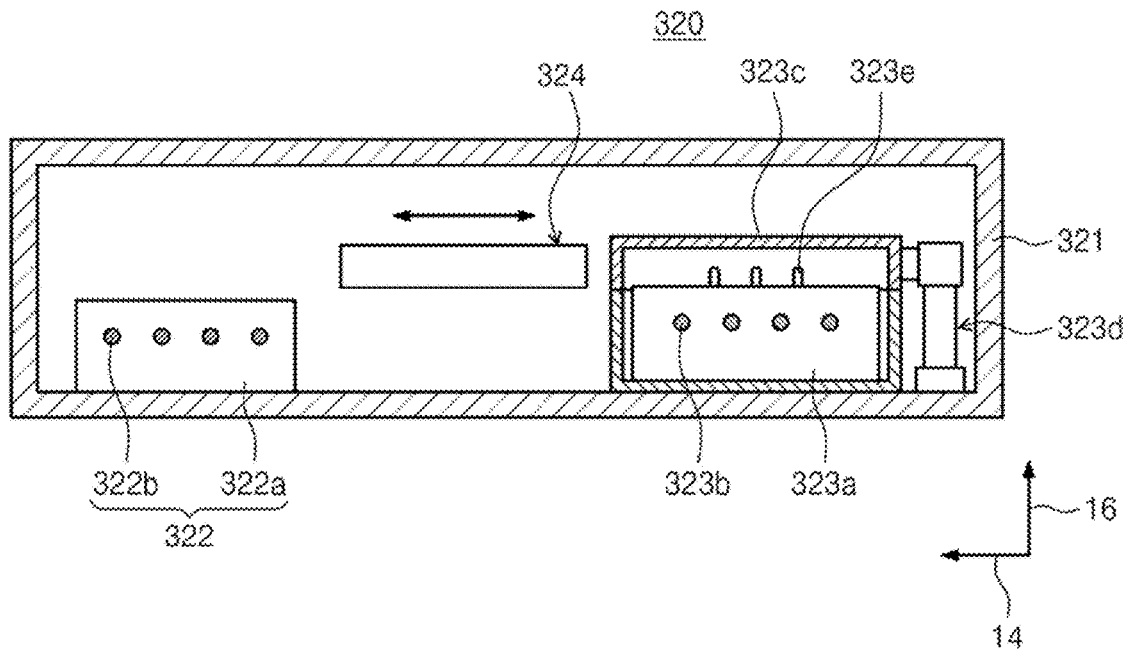
FIG. 6 is a front view of the heat treating chamber of FIG. 5.

FIG. 5 is a top plan view schematically illustrating an example of the heat treating chamber, and FIG. 6 is a front view of the heat treating chamber.

Referring to FIGS. 5 and 6, the heat treating chamber 320 includes a housing 321, a cooling unit 322, a heating unit 323, and a transfer plate 324.

The housing 321 is provided in the shape of a generally rectangular parallelepiped. An entrance (not illustrated) through which the substrate W enters and exits is formed on the sidewall of the housing 321. The entrance may remain open. Optionally, a door (not illustrated) may be provided to open and close the entrance. The cooling unit 322, the heating unit 323, and the transfer plate 324 are provided inside the housing 321. The cooling unit 322 and the heating unit 323 are arranged along the second direction 14. According to an example, the cooling unit 322 may be located closer to the transfer chamber 350 than the heating unit 322.

The cooling unit 322 has a cooling plate 322a. The cooling plate 322a may have a generally circular shape when viewed from the top. The cooling plate 322a is provided with a cooling member 322b. According to an example, the cooling member 322b is formed inside the cooling plate 322a and may be provided as a flow path through which the cooling fluid flows.

The heating unit 323 includes a heating plate 323a, a cover 323c, and a heater 323b. The heating plate 323a has a generally circular shape when viewed from the top. The heating plate 323a has a larger diameter than the substrate W. The heater 323b is installed on the heating plate 323a. The heater 323b may be provided as a heating resistor to which current is applied. The heating plate 323a is provided with lift pins 323e drivable in the vertical direction along the third direction 16. The lift pin 323e receives the substrate W from a transfer means outside the heating unit 323 and places the received substrate W on the heating plate 323a or lifts the substrate W from the heating plate 323a and hands over the substrate W to the external transfer means. According to the example, three lift pins 323e may be provided. The cover 323c has a space with an open lower portion therein.

The cover 323c is located above the heating plate 323a and is moved in a vertical direction by a driver 323d. The space formed by the cover 323c and the heating plate 323a according to the movement of the cover 323c is provided as a heating space for heating the substrate W.

The transfer plate 324 is provided in a substantially disk shape, and has a diameter corresponding to that of the substrate W. A notch 324b is formed at an edge of the transfer plate 324. The notch 324b may have a shape corresponding to a protrusion 3543 formed on the hand 354 of the transfer robot 352 described above. In addition, the notches 324b are provided in a number corresponding to the number of protrusions 3543 formed on the hand 354, and are formed at positions corresponding to the protrusions 3543. When the upper and lower positions of the hand 354 and the transfer plate 324 are changed in the position where the hand 354 and the transfer plate 324 are aligned in the vertical direction, the substrate W is transferred between the hand 354 and the transfer plate 324. The transfer plate 324 is mounted on a guide rail 324d and may be moved between a first area 3212 and a second area 3214 along the guide rail 324d by a driver 324c. A plurality of slit-shaped guide grooves 324a is provided in the transfer plate 324. The guide groove 324a extends from the end of the transfer plate 324 to the inside of the transfer plate 324. The longitudinal direction of the guide grooves 324a is provided along the second direction 14, and the guide grooves 324a are spaced apart from each other along the first direction 12. The guide groove 324a prevents the transfer plate 324 and the lift pins 323e from interfering with each other when the substrate W is transferred between the transfer plate 324 and the heating unit 323.

The substrate W is cooled in the state where the transfer plate 324 on which the substrate W is placed is in contact with the cooling plate 322a. The transfer plate 324 is made of a material having high thermal conductivity so that heat transfer is well performed between the cooling plate 322a and the substrate W. According to the example, the transfer plate 324 may be made of a metal material.

The heating units 323 provided in some of the heat treating chambers 320 may supply a gas while heating the substrate W to improve the adhesion rate of the photoresist to the substrate. According to the example, the gas may be hexamethyldisilane (HMDS) gas.

A plurality of liquid treating chambers 360 is provided. Some of the liquid treating chambers 360 may be provided to be stacked on each other. The liquid treating chambers 360 are disposed at one side of the transfer chamber 350. The liquid treating chambers 360 are arranged side by side along the first direction 12. Some of the liquid treating chambers 360 are provided at positions adjacent to the index module 100. Hereinafter, the liquid treating chambers 360 located to be adjacent to the index module 100 are referred to as front liquid treating chambers 362. Another some of the liquid treating chambers 360 are provided at positions adjacent to the interface module 500. Hereinafter, the liquid treating chambers 360 located to be adjacent to the interface module 500 are referred to as rear liquid treating chambers 364.

The front liquid treating chamber 362 applies a first liquid onto the substrate W, and the rear liquid treating chamber 284 applies a second liquid onto the substrate W. The first liquid and the second liquid may be different types of liquid. According to the exemplary embodiment, the first liquid is an antireflection film, and the second liquid is a photoresist. The photoresist may be coated onto the substrate W coated with the antireflection film. Optionally, the first liquid may be a photoresist, and the second liquid may be an antireflection film. In this case, the antireflection film may be applied onto the substrate W coated with the photoresist. Optionally, the first liquid and the second liquid are the same type of liquid, and both the first liquid and the second liquid may be the photoresist.

The developing block 300b has the same structure as the coating block 300a, and the liquid treating chamber provided in the developing block 300b supplies a developer onto the substrate.

The interface module 500 connects the buffer module 400b with the external exposing module 700. The interface module 500 includes an interface frame 510, an additional process chamber 520, an interface buffer 530, and an interface robot 550.

A fan filter unit for forming a descending airflow therein may be provided at an upper end of the interface frame 510. The additional process chamber 520, the interface buffer 530, and the interface robot 550 are disposed inside the interface frame 510. The additional process chamber 520 may perform a predetermined additional process before the substrate W, which has been processed in the coating block 300a, is loaded into the exposing module 700. Optionally, the additional process chamber 520 may perform a predetermined additional process before the substrate W, which has been completely processed in the exposing module 700, is loaded into the developing block 300b. According to one example, the additional process may be an edge exposure process of exposing an edge region of the substrate W, a top surface cleaning process of cleaning the upper surface of the substrate W, or a lower surface cleaning process of cleaning the lower surface of the substrate W. A plurality of additional process chambers 520 is provided, and may be provided to be stacked on each other. All of the additional process chambers 520 may be provided to perform the same process. Optionally, a part of the additional process chambers 520 may be provided to perform different processes.

The interface buffer 530 provides a space in which the substrate W transferred between the coating block 300a, the additional process chamber 520, the exposing module 700, and the developing block 300b temporarily stays during the transfer. A plurality of interface buffers 530 may be provided, and the plurality of interface buffers 530 may be provided to be stacked on each other.

According to the example, the additional process chamber 520 may be disposed on one side of the transfer chamber 350 based on an extended line in the longitudinal direction and the interface buffer 530 may be disposed on the other side thereof.

The interface robot 550 transfers the substrate W between the coating block 300*a*, the additional process chamber 520, the exposing module 700, and the developing block 300*b*. The interface robot 550 may have a transfer hand that transfers the substrate W. The interface robot 550 may be provided as one or a plurality of robots. According to the example, the interface robot 550 has a first robot 552 and a second robot 554. The first robot 552 may be provided to transfer the substrate W between the coating block 300*a*, the additional process chamber 520, and the interface buffer 530, and the second robot 554 may be provided to transfer the substrate W between the interface buffer 530 and the exposing module 700, and the second robot 554 may be provided to transfer the substrate W between the interface buffer 530 and the developing block 300*b*.

The first robot 552 and the second robot 554 each include a transfer hand on which the substrate W is placed, and the hand may be provided to be movable forward and backward, rotatable about an axis parallel to the third direction 16, and movable along the third direction 16.

All of the hands of the index robot 132, the first robot 552, and the second robot 554 may be provided in the same shape as that of the hand 352 of the transfer robot 354. Optionally, the hand of the robot directly exchanging the www with the carrying plate 324 of the heat treating chamber may be provided in the same shape as that of the hand 352 of the carrying robot 354, and the hands of the remaining robots may be provided in a different shape.

According to the exemplary embodiment, the index robot 132 is provided to directly exchange the substrate W with the heating unit 323 of the front heat treating chamber 320 provided in the coating block 300*a*.

Further, the transfer robots 352 provided to the coating block 300*a* and the developing block 300*b* may be provided to directly exchange the substrate W with the transfer plate 324 located in the heat treating chamber 320.

A plurality of buffer modules 400*a* and 400*b* is provided. Some of the buffer modules 400*a* and 400*b* are disposed between the index module 100 and the processing module 300. Hereinafter, the foregoing buffer chambers 400*a* and 400*b* are referred to as front buffers 400*a*. A plurality of front buffers 400*a* is provided, and is positioned to be stacked on each other in the vertical direction. Some of the buffer modules 400*a* and 400*b* are disposed between the processing module 300 and the interface module 500. Hereinafter, the foregoing buffer chambers 400*a* and 400*b* are referred to as rear buffers 400*b*. The rear buffers 400*b* are provided in plurality, and are positioned to be stacked on each other in the vertical direction. Each of the front buffers 400*a* and the rear buffers 400*b* temporarily stores a plurality of substrates W. The substrate W stored in the front buffer 400*a* is loaded or unloaded by the index robot 132 and the transfer robot 352. The substrate W stored in the rear buffer is loaded or unloaded by the transfer robot 352 and the first robot 552.

Hereinafter, the buffer modules 400*a* and 400*b* will be described based on the front buffer 400*a*.

Figure 7:
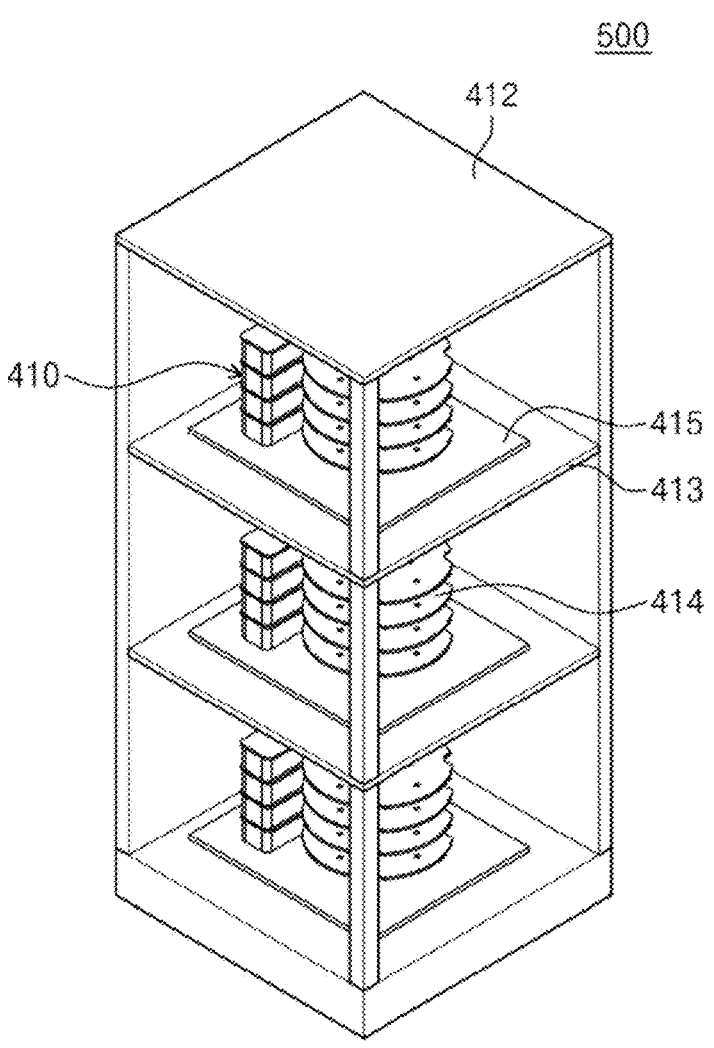
FIG. 7 is a schematic diagram illustrating a part of a buffer module according to the exemplary embodiment of the present invention.
Figure 8:
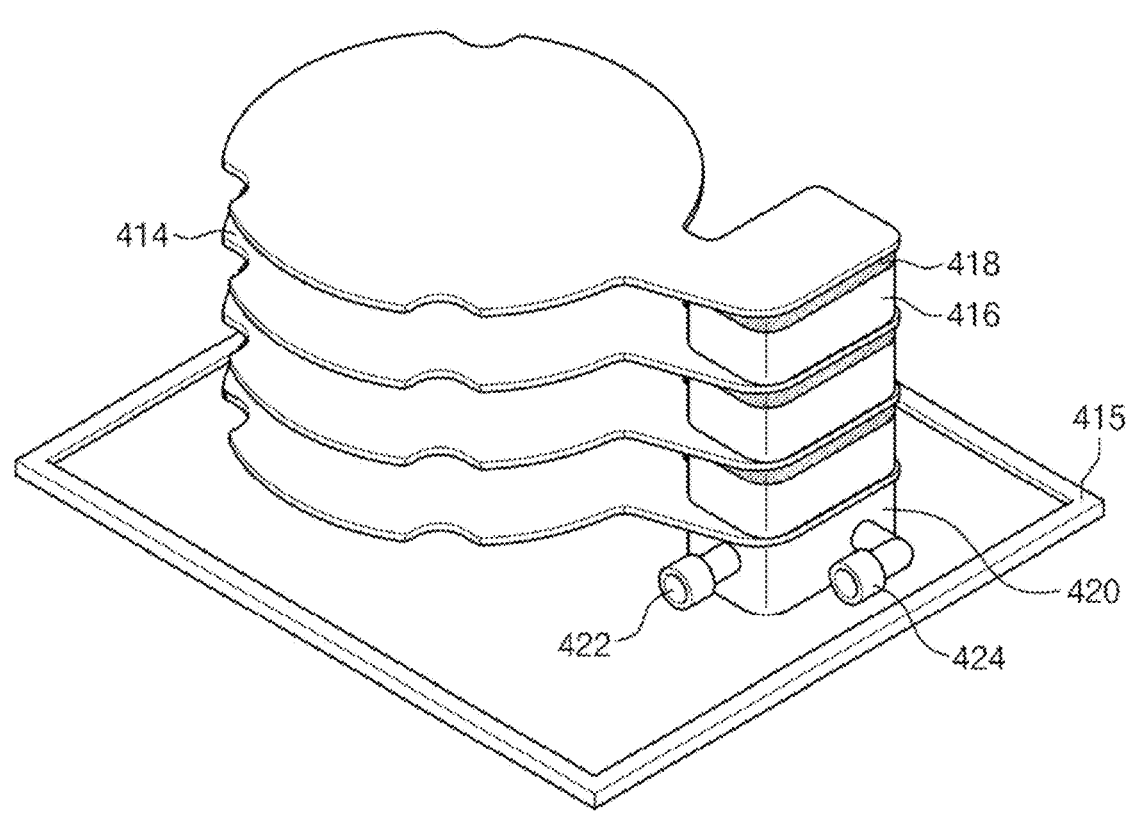
FIG. 8 is a perspective view of a buffer unit according to the exemplary embodiment of the present invention.
Figure 9:
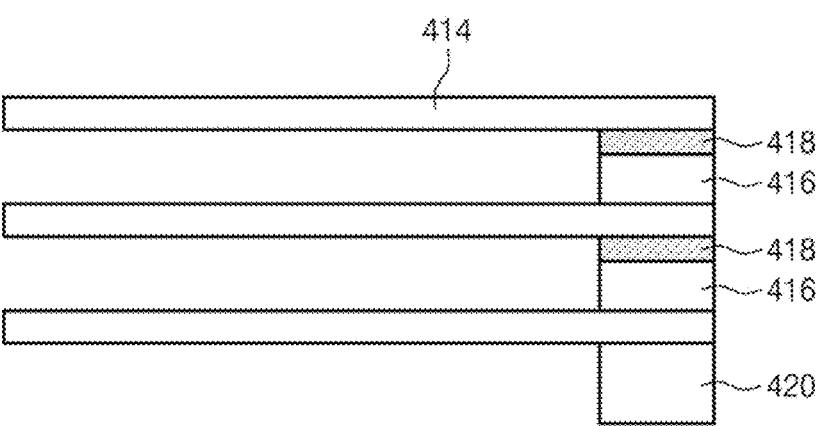
FIG. 9 is a front view of the buffer unit according to the exemplary embodiment of the present invention.

FIG. 7 is a schematic diagram illustrating a part of the buffer module according to the exemplary embodiment of the present invention. FIG. 8 is a perspective view of a buffer unit according to the exemplary embodiment of the present invention. FIG. 9 is a front view of the buffer unit according to the exemplary embodiment of the present invention.

Hereinafter, referring to FIGS. 7 to 9, the buffer module 400*a* includes a frame 401, a buffer unit 410, and a buffer robot 430.

The frame 401 may be provided in the shape of a rectangular parallelepiped with an empty interior. The frame 401 is disposed between the index module 100 and the liquid treating chamber 360. The frame 401 is provided with the buffer unit 410 and the buffer robot 430 therein.

The buffer unit 410 temporarily stores the substrate W during a process of treating the substrate W. The buffer unit 410 may be provided in a structure of cooling the substrate W. The buffer unit 410 includes a housing 412, a support plate 414, a connection block 416, and an anti-vibration pad 418.

The housing 412 has an empty space therein. The housing 412 has a generally rectangular parallelepiped shape. The housing 412 is located inside the frame 401 of the buffer module 400*a*. The housing 412 is positioned between the index module 100 and the processing module 300. The housing 412 has an open side. For example, two sides of the housing 412 are open. The open space of the housing 412 is provided as a passage through which the substrate W enters and exits. A pedestal 413 is provided inside the housing 412.

The pedestal 413 may be provided as a rectangular plate. A plurality of pedestals 413 may be provided. Each of the pedestals 413 is positioned vertically in parallel. A plurality of support plates 414 may be stacked on top of each pedestal 413. For example, three pedestals 413 may be provided.

The substrate W is placed on the support plate 414. The support plate 414 is provided in a circular shape when viewed from above. The support plate 414 may be provided with a size corresponding to that of the substrate W.

In the above-described example, the case where the buffer unit 410 is divided into three spaces inside the housing 412 to provide the support plate 414 has been described as the example, but a different number may be provided.

A plurality of support plates 414 is provided. Each of the support plates 414 is arranged to be stacked in the vertical direction. A connection block 416 is positioned between the support plates 414. The support plates 414 are spaced apart from each other by the connection block 416. Each support plate 414 is fixedly coupled to the connection block 416. Each of the support plates 414 may be provided with the same size. Each of the support plates 414 may be provided to be spaced apart from each other at the same height.

The connection blocks 416 are respectively positioned between the support plates 414. The connection block 416 allows the adjacent support plates 414 to be vertically spaced apart from each other. A plurality of connection blocks 416 may be provided in a substantially rectangular parallelepiped shape. The connection blocks 416 are provided to be stacked on each other.

The base block 420 supports the lowermost support plate 414. A support plate 415 is positioned under the base block 420. The support plate 415 supports the base block 420. The base block 420 is provided with an inlet port 422, an outlet port 424, a cooling fluid supply flow path 423, and a cooling fluid recovery flow path 425.

The inlet port 422 receives a cooling fluid from the outside and supplies the received cooling fluid to the cooling fluid supply flow path 423. The inlet port 422 is located on one side of the base block 420.

The outlet port 424 discharges the cooling fluid of the cooling fluid recovery flow path 425 to the outside. The outlet port 424 is located on one side of the base block 420.

Sides of the base block 420 provided with the inlet port 422 and the outlet port 424 may be perpendicular to each other. The inlet port 422 and the outlet port 424 may be provided at the same height from the support plate 415.

The cooling fluid supply flow path 423 is provided inside the base block 420 and the connection block 416. One side of the cooling fluid supply flow path 423 is connected to the inlet port 422, and the other side is branched and connected to the inside of the support plate 414. The cooling fluid supply flow path 423 allows the cooling fluid supplied from the inlet port 422 to be supplied to the support plate 414.

The cooling fluid recovery flow path 425 is provided inside the base block 420 and the connection block 416. One side of the cooling fluid recovery flow path 425 is connected to the inside of each support plate 414, and the other side is connected to the outlet port 424. The cooling fluid recovery flow path 425 allows the cooling fluid discharged from the support plate 414 to be discharged to the outlet port 424. The cooling fluid recovery flow path 425 and the cooling fluid supply flow path 423 may be provided in parallel to each other.

In this case, a cooling member 4142 may be provided inside the support plate 414. The cooling member 4142 may be provided as a cooling flow path 4142 formed inside the support plate.

The cooling flow path 4142 may cool the substrate W placed on the support plate 414. The cooling flow path 4142 is provided on the support plate 414. The cooling flow path 4142 may be provided as a single flow path. The cooling flow path 4142 is formed over the entire area of the support plate 414. The cooling flow path 4142 may be provided in a concentric shape on the support plate 414 when viewed from the top. For example, the cooling flow path 4142 may be provided in three circular shapes. A cooling fluid supplied from the outside flows through the cooling flow path 4142. For example, the cooling fluid may be provided as cooling water. The cooling passage 4142 has one end connected to the cooling fluid supply flow path 423 and the other end connected to the cooling fluid recovery flow path 425.

The anti-vibration pad 418 is disposed between the support plate 414 and the connection block 416. The anti-vibration pad 418 prevents the vibration from being transmitted from bottom to top. Holes (not illustrated) may be formed in the anti-vibration pad 418 in the vertical direction so that the cooling fluid supply flow path 423 and the cooling fluid recovery flow path 425 pass therethrough.

A plurality of anti-vibration pads 418 may be provided. The anti-vibration pads 418 may be provided with the same material. For example, the anti-vibration pad 418 may be made of a rubber material. In this case, the anti-vibration pads 418 may be provided with the same thickness or may be provided with different thicknesses.

Figure 10:
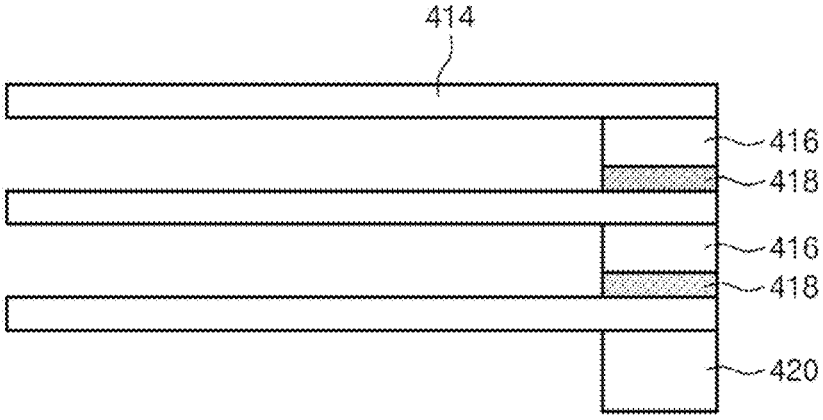
FIG. 10 is a front view of a buffer unit according to another exemplary embodiment of the present invention.

The anti-vibration pad 418 may be disposed between the upper surfaces of the connection blocks 416 and the lower surfaces of the supporting plates 414 as illustrated in FIG. 9. Optionally, the anti-vibration pad 418 may be disposed between the upper surfaces of the support plates 414 and the lower surfaces of the connection blocks 416 as illustrated in FIG. 10.

Figure 12:
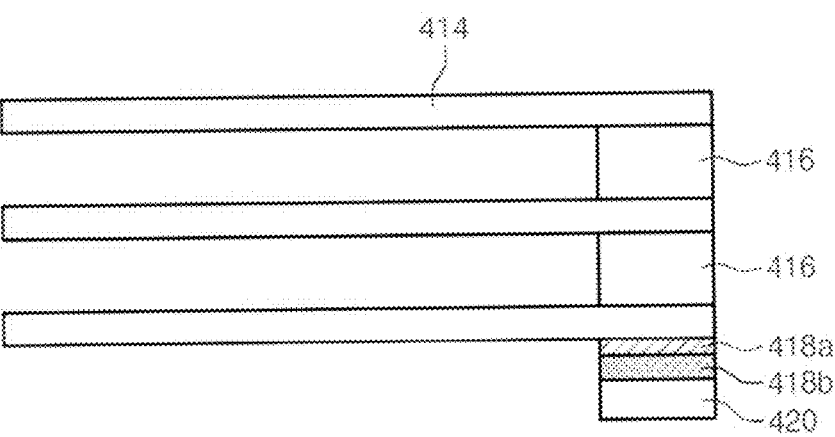
FIG. 12 is a front view of a buffer unit according to another exemplary embodiment of the present invention.

In the above-described example, the anti-vibration pad 418 is illustrated as being disposed between the support plate 414 and the connection block 416. However, as illustrated in FIG. 12, the anti-vibration pad 418 may be disposed between the support plate 414 and the base block 420. A single anti-vibration pad 418 may be provided, or a plurality of anti-vibration pads 418 may be provided. When a plurality of anti-vibration pads 418 is provided, they may be provided with different materials. The detailed configuration and function of the anti-vibration pad 418 are the same as described above.

Figure 13:
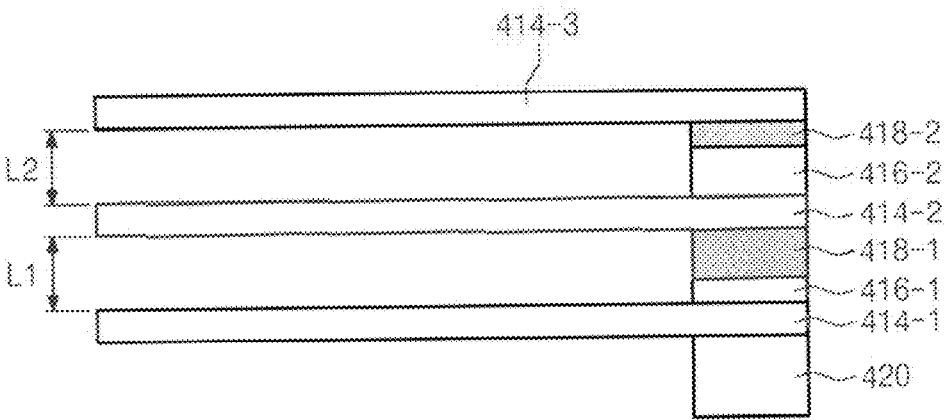
FIG. 13 is a front view of a buffer unit according to another exemplary embodiment of the present invention.
Figure 14:
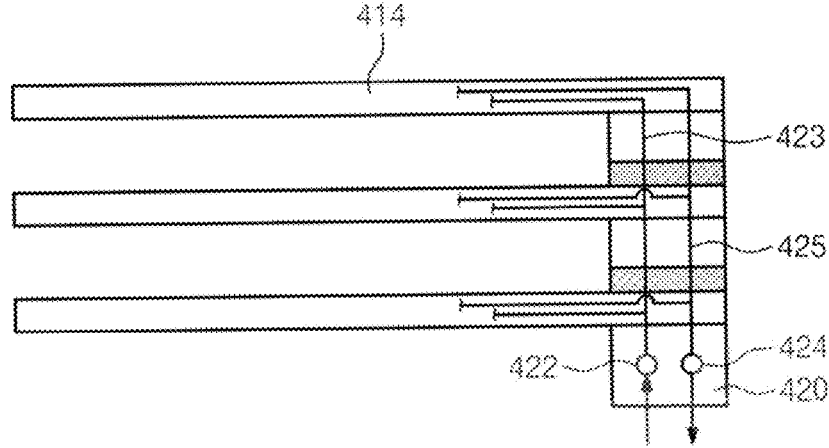
FIG. 14 is a diagram illustrating a cooling flow path included in the buffer unit.
Figure 15:
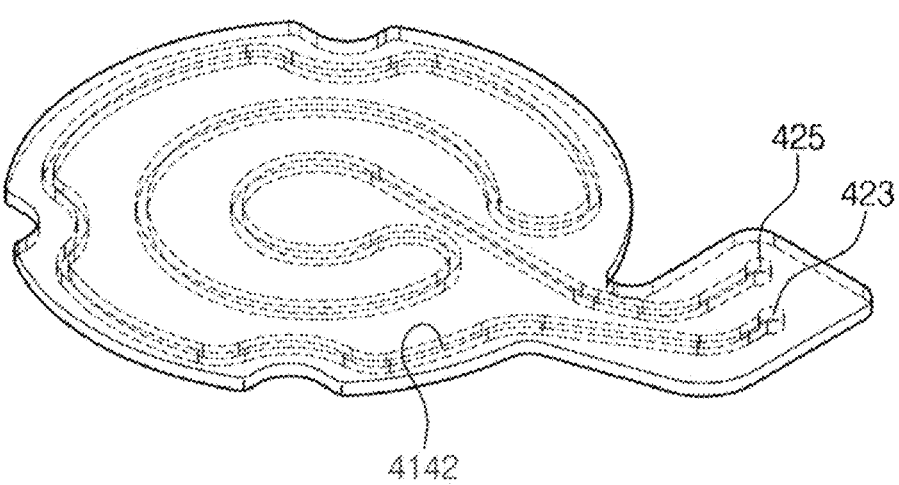
FIG. 15 is a diagram illustrating a cooling flow path included in a support plate.

In the above-described example, it is illustrated that the anti-vibration pad 418 has the same thickness. However, unlike this, when the anti-vibration pad 418 is provided between each support plate 414 and each connection block 416 as illustrated in FIG. 13, the anti-vibration pads 418 may be provided with different thicknesses. For example, since the number of vibrations decreases as the vibration reaches the upper part by the anti-vibration pad 418 disposed at the lower portion, the anti-vibration pad 418 may be provided with a thinner thickness as it is disposed at the top. At this time, the connection block 416 may also be provided with a different thickness. The connection block 416 may be provided with a greater thickness toward the top. The sum of the thicknesses of the adjacent connection block and anti-vibration pad may all be the same so that the respective support plates 414 are spaced apart from each other at a constant interval. For example, referring to FIG. 13, a first anti-vibration pad 418-1 and a first connection block 416-1 may be disposed between the first support plate 414-1 and the second support plate 414-2, and a second anti-vibration pad 418-2 and a second connection block 416-2 may be positioned between the second support plate 414-2 and the third support plate 414-3. In this case, the sum L1 of the thicknesses of the first anti-vibration pad 418-1 and the first connection block 416-1 may be the same as the sum L2 of the thicknesses of the second anti-vibration pad 418-2 and the second connection block 416-2.

It is preferable that the anti-vibration pads 418 are thickly provided to increase the anti-vibration effect, but the overall thickness of the buffer unit is thick, making it difficult to install the buffer unit on the frame. A vibration damping effect can be sufficiently obtained from the lower anti-vibration pad 418, so that the vibration decreases as it reaches the upper support plate 414. According to the exemplary embodiment, as the anti-vibration pad 418 is provided on the upper portion, the thickness thereof may be reduced to keep the overall height of the buffer unit small.

When the anti-vibration pads 418 are provided with different thicknesses, the spacing between the adjacent support plates 414 is different, so that it is complicated to control the movement height of the transfer robot 352 in the vertical direction when transferring the substrate to the support plate. However, it is possible to constantly maintain the intervals between the support plates 414 by providing the thickness of the connection blocks 416 in inverse proportion to the thickness of the adjacent anti-vibration pads 418, so that it is possible to easily control the transfer robot 352.

Figure 11:
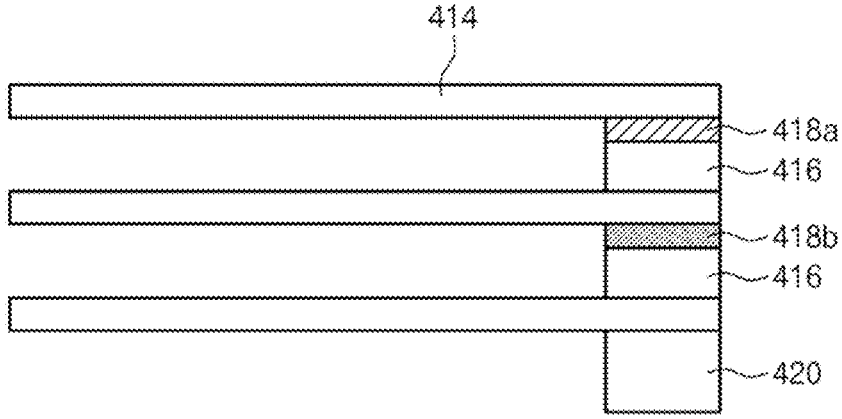
FIG. 11 is a front view of a buffer unit according to another exemplary embodiment of the present invention.

In the above example, it has been described that when the plurality of anti-vibration pads 418 is provided, the material is the same, but the anti-vibration pads 418 may be provided with different materials. For example, the anti-vibration pad 418 may be provided with a rubber material 418a and a metal material 418b as illustrated in FIG. 11 to absorb different numbers of vibrations. The detailed configuration and function of the anti-vibration pad 418 are the same as described above.

The buffer robot 430 transfers the substrate W. The buffer robot 430 includes a hand 432, an arm 434, and a support 436. The hand 432 is fixedly installed on the arm 434. The arm 434 is provided in a stretchable structure, such that the hand 432 is movable in the second direction 14. The arm 434 is coupled to the support 436 so as to be linearly movable in the third direction 16 along the support 436. The support 436 may be provided longer in an upper or lower direction than the arm 434. The buffer robot 430 may be provided such that the hand 432 is only biaxially driven along the second direction 14 and the third direction 16.

The buffer module 400*b* temporarily stores the processed substrates W before the substrates W are moved to the exposing module 700. The buffer module 400*b* is provided substantially the same as the buffer module 400*a*.

The foregoing detailed description illustrates the present invention. In addition, the above description illustrates and describes the exemplary embodiments of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A buffer unit for storing or treating a substrate, the buffer unit comprising:
   a plurality of support plates arranged to be stacked in a vertical direction and supporting a substrate on top of each respective one of the plurality of support plates;
   a plurality of connection blocks respectively positioned between the support plates so that respective adjacent support plates, of the plurality of support plates, are vertically spaced apart from each other; and
   an anti-vibration pad disposed between a respective one of the plurality of support plates and each respective one of the plurality of connection blocks to prevent vibration from being transmitted from a bottom to the top; and
   a first anti-vibration pad and a second anti-vibration pad are between a first respective adjacent support plate, of the plurality of connection blocks, and a first support plate, of the plurality of support plates,
   the first anti-vibration pad and the second anti-vibration pad being provided with different materials.

2. The buffer unit of claim 1, wherein a cooling flow path through which a cooling fluid for cooling the substrate is formed in at least one of the plurality of support plates.

3. A buffer unit, comprising:
   support plates including a first support plate, a second support plate and a third support plate, the second support plate disposed above the first support plate, the third support plate disposed above the second support plate, the support plates being configured to support a substrate on top of each respective one of the support plates;
a first connection block inserted between the first support plate and the second support plate such that the first support plate and the second support plate are vertically spaced apart from each other;
a second connection block inserted between the second support plate and the third support plate such that the second support plate and the third support plate are vertically spaced apart from each other;
a first anti-vibration pad disposed between the first support plate and the second support plate to prevent vibration from being transmitted from a bottom to the top; and
a second anti-vibration pad disposed between the second support plate and the third support plate to prevent vibration from being transmitted from the bottom to the top, the first anti-vibration pad being provided with a thicker thickness than a thickness of the second anti-vibration pad.

4. The buffer unit of claim 3, wherein the first anti-vibration pad is disposed between the first connection block and the first support plate, and
   the second anti-vibration pad is disposed between the second connection block and the second support plate.

5. The buffer unit of claim 3, wherein the first anti-vibration pad and the second anti-vibration pad are provided with different materials.

6. The buffer unit of claim 3, wherein the first connection block is provided with a thinner thickness than a thickness of the second connection block.

7. The buffer unit of claim 6, wherein a sum of the thicknesses of the first connection block and the first anti-vibration pad is the same as a sum of the thicknesses of the second connection block and the second anti-vibration pad.

8. The buffer unit of claim 3, wherein a cooling flow path through which a cooling fluid for cooling a substrate flows is formed in each of the first to third support plates.

9. The buffer unit of claim 8, further comprising:
   a base block disposed under the first support plate,
   wherein the base block includes:
   an inlet port for receiving a cooling fluid from the outside; and
   an outlet port for discharging the cooling fluid to the outside, and
   each of the first support plate, the second support plate, the third support plate, the first connection block, and the second connection block is provided with
   a cooling fluid supply flow path connected to the inlet port, and
   a cooling fluid recovery flow path connected to the outlet port, and
   the cooling flow path has a first end connected to the cooling fluid supply flow path and a second end connected to the cooling fluid recovery flow path.

* * * * *